(12) United States Patent
Chen et al.

(10) Patent No.: US 11,715,594 B2
(45) Date of Patent: Aug. 1, 2023

(54) VERTICALLY-STACKED INTERDIGITATED METAL-INSULATOR-METAL CAPACITOR FOR SUB-20 NM PITCH

(71) Applicant: International Business Machines Corporation, Armonk, NY (US)

(72) Inventors: Hsueh-Chung Chen, Cohoes, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/303,390

(22) Filed: May 27, 2021

(65) Prior Publication Data

US 2022/0384564 A1  Dec. 1, 2022

(51) Int. Cl.
*H01G 4/005* (2006.01)
*H01G 4/10* (2006.01)
*H01L 49/02* (2006.01)
*H01G 4/008* (2006.01)

(52) U.S. Cl.
CPC .............. *H01G 4/005* (2013.01); *H01G 4/10* (2013.01); *H01L 28/90* (2013.01); *H01G 4/008* (2013.01)

(58) Field of Classification Search
CPC ................................ H01G 4/005; H01G 4/008
See application file for complete search history.

(56) References Cited

U.S. PATENT DOCUMENTS

| | | | |
|---|---|---|---|
| 6,451,667 B1 | 9/2002 | Ning | |
| 6,690,570 B2 | 2/2004 | Hajimiri | |
| 7,186,625 B2 | 3/2007 | Chudzik | |
| 7,635,908 B2 | 12/2009 | Barth | |
| 7,939,910 B2 | 5/2011 | Cho | |
| 8,138,539 B2 | 3/2012 | Barth | |
| 8,917,491 B2 * | 12/2014 | Masuda | ................ H01G 9/045 361/321.1 |
| 2002/0151150 A1 | 10/2002 | Bernstein | |
| 2002/0155676 A1 | 10/2002 | Stetter | |
| 2003/0030125 A1 * | 2/2003 | Goldberger | ............. H01L 28/40 257/532 |

(Continued)

FOREIGN PATENT DOCUMENTS

| | | | | |
|---|---|---|---|---|
| JP | 2016058618 A | * | 4/2016 | |
| WO | WO-2021079565 A1 | * | 4/2021 | |
| WO | WO-2021181774 A1 | * | 9/2021 | ........... H04N 21/252 |

*Primary Examiner* — Eric W Thomas

(74) *Attorney, Agent, or Firm* — Michael A. Petrocellli

(57) ABSTRACT

An interdigitated metal-insulator-metal capacitor structure is formed by a first unitary body of a first conductive material that includes a first metal plate, a first set of interdigitated electrodes protruding upwards from a top surface of the first metal plate, and a first set of connecting vias protruding downwards from a bottom surface of the first metal plate. A second unitary body of a second conductive material is disposed above the first unitary body and electrically separated from the first unitary body by an insulating layer. The second unitary body includes a second metal plate, a second set of interdigitated electrodes protruding downwards from a bottom surface of the second metal plate, and a second set of connecting vias protruding upwards from a top surface of the second metal plate. The first set of interdigitated electrodes are interleaved with the second set of interdigitated electrodes.

8 Claims, 16 Drawing Sheets

(56) References Cited

U.S. PATENT DOCUMENTS

| | | | | |
|---|---|---|---|---|
| 2003/0036244 | A1* | 2/2003 | Jones | H01L 27/0805 |
| | | | | 257/E27.048 |
| 2006/0234443 | A1 | 10/2006 | Yang | |
| 2007/0155090 | A1* | 7/2007 | Barth | H01L 28/91 |
| | | | | 257/E27.048 |
| 2015/0287534 | A1* | 10/2015 | Masuda | H01G 4/224 |
| | | | | 361/301.4 |
| 2016/0049361 | A1* | 2/2016 | Wang | H01L 28/40 |
| | | | | 257/534 |
| 2022/0130949 | A1* | 4/2022 | Huang | H01L 28/91 |

* cited by examiner

US 11,715,594 B2

VERTICALLY-STACKED INTERDIGITATED METAL-INSULATOR-METAL CAPACITOR FOR SUB-20 NM PITCH

BACKGROUND

The present invention generally relates to the field of semiconductor devices, and more particularly to fabrication of an interdigitated metal-insulator-metal capacitor (MIMCAP) device.

Metal-insulator-metal capacitors (MIMCAP) are important components in memory, logic and analog circuits. MIMCAPs are typically fabricated with metal interconnections and do not utilize valuable silicon real estate. MIMCAPs can help reducing electrical resistances, noise (used as decoupling cap) and electromagnetic radiation. For electromagnetic interference, on-chip capacitors such as MIMCAPs can be much more efficient than off-chip capacitors. The MIMCAP structure is usually embedded into upper back-end-of-the-line (BEOL) layers. Traditional methods of fabricating MIMCAPs include stacking of multiple MIMCAP layers that involve numerous lithography and etching steps. Some MIMCAP designs, especially those of a vertical MIMCAP structures, require many extra processing steps that may not be easily integrable into a conventional BEOL process. Thus, the complexity of current MIMCAP fabrication methods can cause problems during the semiconductor manufacturing process that can hinder capacitance density increase and yield improvement.

SUMMARY

There is a need for alternative designs and techniques for forming MIMCAPs that can reduce the number of processing steps while increasing the total capacitance of the MIMCAP device.

Shortcomings of the prior art are overcome and additional advantages are provided through the provision of a semiconductor structure that includes a first unitary body of a first conductive material including a first metal plate, a first set of interdigitated electrodes protruding upwards from a top surface of the first metal plate, and a first set of connecting vias protruding downwards from a bottom surface of the first metal plate, a second unitary body of a second conductive material disposed above the first unitary body, the second unitary body comprising a second metal plate, a second set of interdigitated electrodes protruding downwards from a bottom surface of the second metal plate, and a second set of connecting vias protruding upwards from a top surface of the second metal plate, the first set of interdigitated electrodes being interleaved with the second set of interdigitated electrodes, and an insulating layer disposed between the first unitary body and the second unitary body for electrically separating the first set of interdigitated electrodes from the second set of interdigitated electrodes.

Another embodiment of the present disclosure provides a method of forming a semiconductor structure that includes forming a first set of connecting vias within a first dielectric layer disposed above a semiconductor substrate, depositing a first conductive material above the first dielectric layer, the first conductive material filling the first set of connecting vias, patterning a top portion of the first conductive material to form a first set of interdigitated electrodes, a remaining portion of the first conductive material below the first set of interdigitated electrodes including a first metal plate, and conformally depositing an insulating layer above the first conductive material for electrically separating the first set of interdigitated electrodes and the first metal plate.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
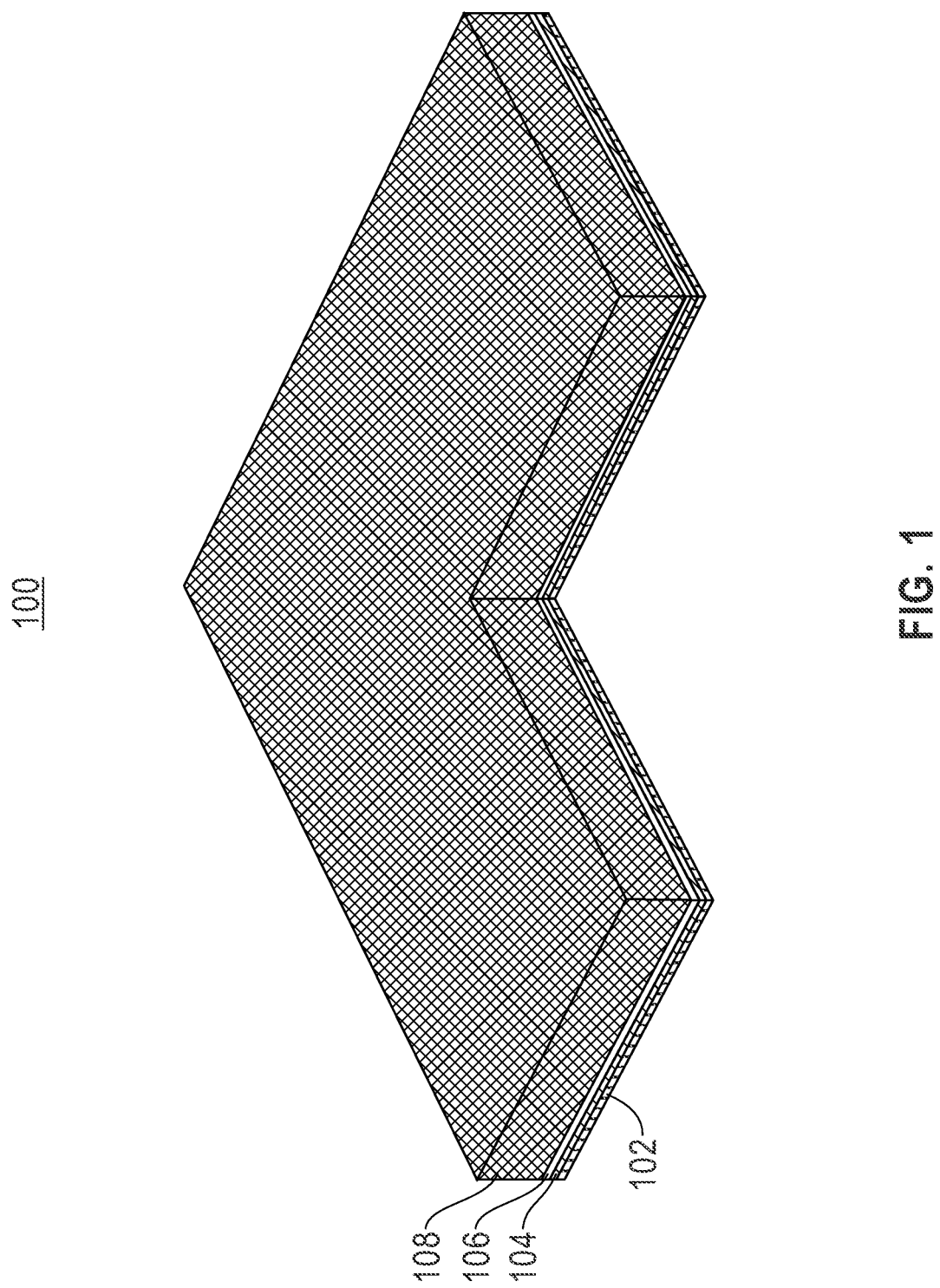
FIG. 1 is a 3D view of a semiconductor structure at an intermediate step during a semiconductor manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Current metal-insulator-metal capacitor (MIMCAP) designs, especially those of vertical MIMCAP structures, require many extra processing steps that may not be easily integrable into conventional BEOL processes. This may cause problems during the semiconductor manufacturing process that can hinder capacitance density increase and yield improvement. Those skilled in the art will recognize that capacitance density refers to capacitance per chip surface area consumed by the capacitor(s) (e.g., in units of femtofarads (fF)/micrometer squared ($\mu m2$)). Unfortunately, high capacitance densities cannot be achieved with conventional planar dual-electrode or triple-electrode MIMCAPs.

Furthermore, while some three-dimensional (3D) MIMCAP structures have been developed to provide increased capacitance density, techniques for manufacturing these 3D MIMCAPS are not readily integrated into current process flows and may be deemed cost-prohibitive.

Therefore, embodiments of the present disclosure provide a method and associated structure for fabricating a 3D vertically stacked interdigitated MIMCAP structure with interdigitated electrodes, connecting vias, and electrode plates formed within respective single unitary bodies and separated by a high-k insulating layer. The proposed interdigitated MIMCAP structure is formed using a reduced number of processing steps (i.e., five lithography steps and five etching steps) that decreases the complexity of current MIMCAP fabrication, thereby facilitating capacitance density increase and yield improvement. Specifically, total capacitance in the proposed MIMCAP structure is increased by increasing the aspect ratio of the interdigitated electrodes or fingers. Embodiments by which the 3D vertically stacked interdigitated MIMCAP structure can be formed are described in detailed below by referring to the accompanying drawings in FIGS. 1-16.

Referring now to FIG. 1, a 3D view of a semiconductor structure 100 at an intermediate step during a semiconductor manufacturing process is shown, according to an embodiment of the present disclosure. Particularly, in this embodiment, the described intermediate step illustrates a first step during the process of forming a vertically stacked interdigitated metal-insulator-metal capacitor. As shown in the figure, at this step of the manufacturing process, the semiconductor structure 100 includes an isolation stack formed by a first dielectric layer 104, a first insulation layer 106, and a second dielectric layer 108. The isolation stack is formed above a semiconductor substrate 102.

The semiconductor substrate 102 can include, for example, a bulk semiconductor structure or a semiconductor-on-insulator structure with front-end-of the line (FEOL) features (e.g., active semiconductor devices, passive semiconductor devices, etc.) and middle-of-the-line (MOL) features (e.g., contacts, etc.) not shown in the figure. The semiconductor structure 100 can further include back-end-of-the-line (BEOL) metal levels (M0-Mx) above the semiconductor substrate 102. The BEOL metal levels (not shown) can include various metal features (e.g., wires and via interconnects including single or dual-damascene structures, metal pads, passive devices, etc.) contained within dielectric layers. As mentioned above, the present invention is directed towards a BEOL vertically stacked interdigitated metal-insulator-metal capacitor (MIMCAP) structure suitable for sub-20 nm pitch. Therefore, the FEOL features, MOL features and other BEOL features have been omitted from the description and drawings in order to allow the reader to focus on the relevant aspects of the disclosed semiconductor structure embodiments.

According to an embodiment, the first dielectric layer 104 can be, for example, a silicon dioxide layer. This silicon dioxide layer can be a TEOS silicon dioxide layer. Those skilled in the art will recognize that a TEOS silicon dioxide layer is a silicon dioxide layer deposited by plasma-enhanced chemical vapor deposition (PECVD) using tetraethyl orthosiliciate (TEOS) as the silicon source. The first dielectric layer 104 may have a thickness varying from approximately 10 nm to approximately 10 µm and ranges therebetween.

The first insulation layer 106 is formed above the first dielectric layer 104 using any suitable deposition process. The first insulation layer 106 may include, for example, a dielectric material such as nitrogen-doped silicon carbide (NBLoK) which may function as both a barrier, particularly when a low-k material that may be subject to diffusion of moisture is used as interlevel dielectric, and an etch stop for subsequently formed vias. The first insulation layer 106 may have a thickness varying from approximately 1 nm to approximately 500 nm and ranges therebetween.

The second dielectric layer 108 may include analogous materials and may be formed in similar ways as the first dielectric layer 104. However, the second dielectric layer 108 formed above the first insulation layer 106 can be relatively thicker than the first dielectric layer 104 such that bottom connecting vias (not shown) can be formed within the second dielectric layer 108, as will be described in detail below. For example, in an embodiment, the second dielectric layer 108 may have a thickness varying from approximately 10 nm to approximately 10 µm, and ranges therebetween.

Figure 2:
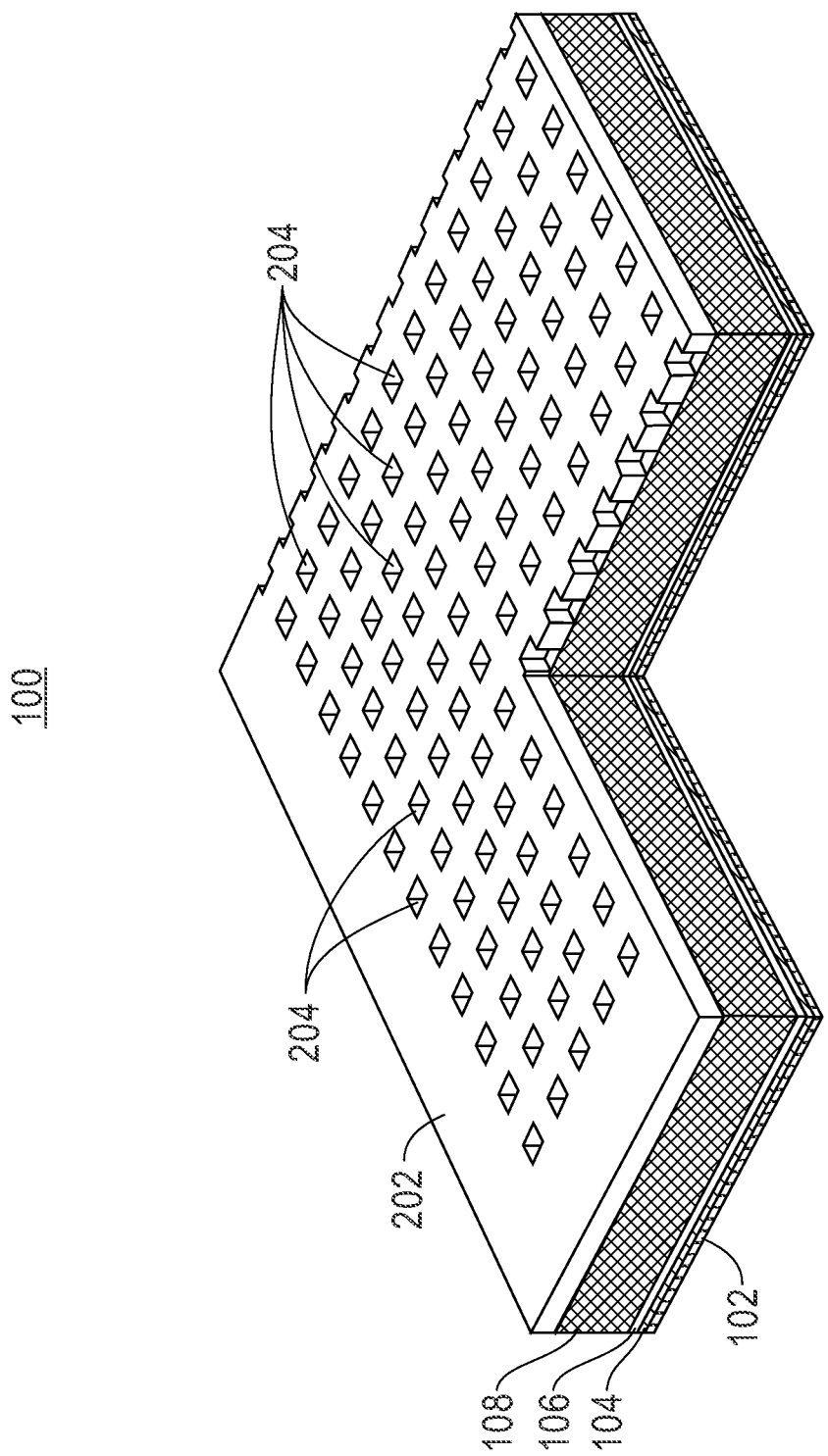
FIG. 2 is a 3D view of the semiconductor structure after depositing a first photoresist layer, according to an embodiment of the present disclosure.
Figure 3:
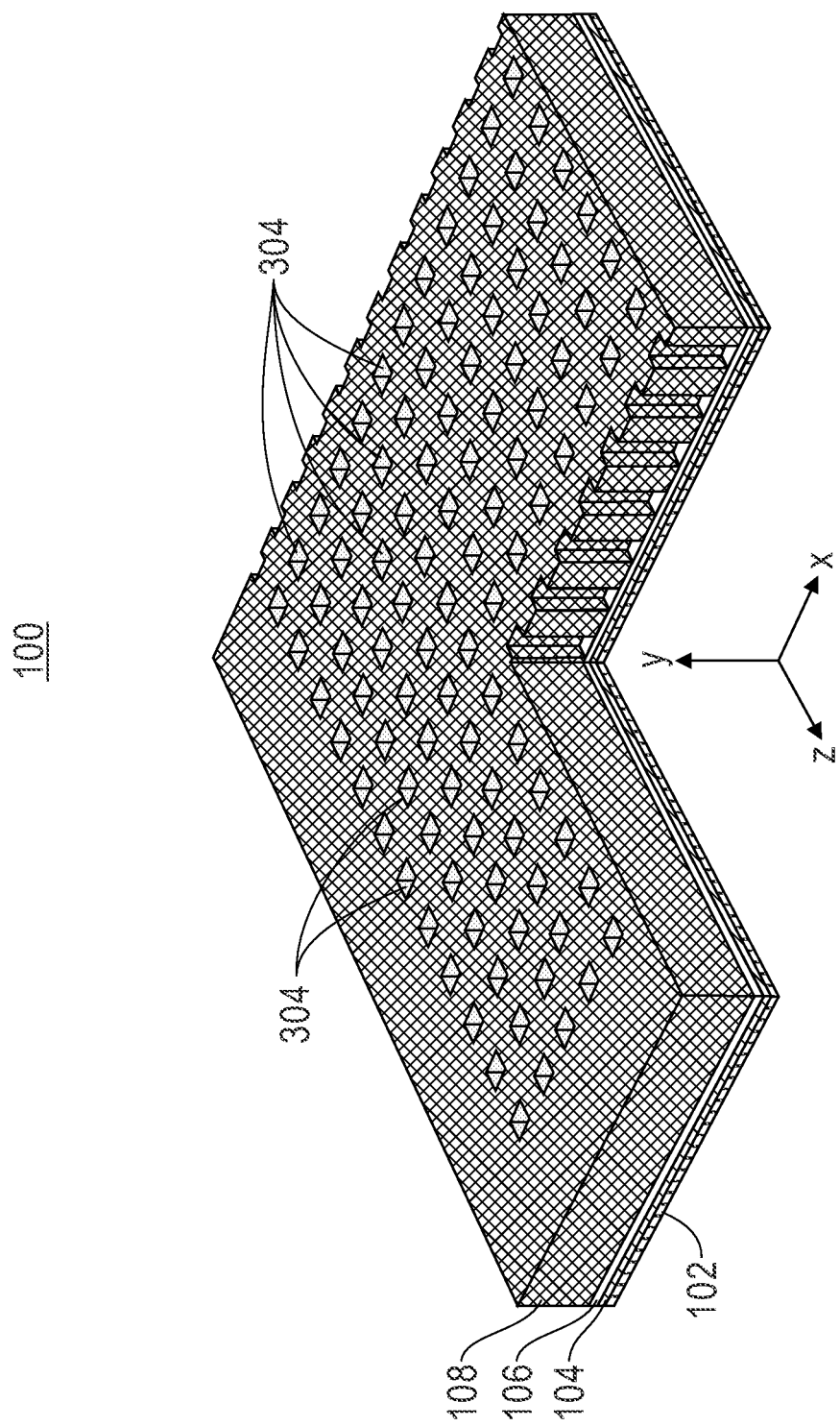
FIG. 3 is a 3D view of the semiconductor structure after forming bottom connecting vias, according to an embodiment of the present disclosure.

Referring now to FIG. 2 and FIG. 3 simultaneously, 3D views of the semiconductor structure 100 after depositing a first photoresist layer 202 and forming bottom connecting vias 304 are shown, according to an embodiment of the present disclosure. The first photoresist layer 202 is deposited above the second dielectric layer 108 for forming the bottom connecting vias 304 using well-known lithography and reactive ion etch (RIE) processing.

As known by those skilled in the art, patterning of the second dielectric layer 108 to form the bottom connecting vias 304 involves exposing a pattern 204 on the first photoresist layer 202 and transferring the exposed pattern to the second dielectric layer 108, as shown in FIG. 3. After transferring the pattern 204 and forming the bottom connecting vias 304, the first photoresist layer 202 can be removed using any photoresist striping method known in the art including, for example, plasma ashing.

With continued reference to FIG. 3, according to an embodiment, the bottom connecting vias 304 include a plurality of trenches that extend vertically through the second dielectric layer 108 until a top portion of the first insulation layer 106 (i.e., etch stop layer). Thus, a depth of each of the bottom connecting vias 304 (as measured in the y-direction) may at least be equal to a thickness of the second dielectric layer 108. In an exemplary embodiment, the depth of the bottom connecting vias 304 may vary between approximately 100 nm and approximately 10 μm and ranges therebetween. A width of each of the bottom connecting vias 304 (as measured in the x-direction) may vary, for example, between approximately 10 nm and approximately 1 μm and ranges therebetween, although a width less than 10 nm and greater than 1 μm may be acceptable.

Figure 4:
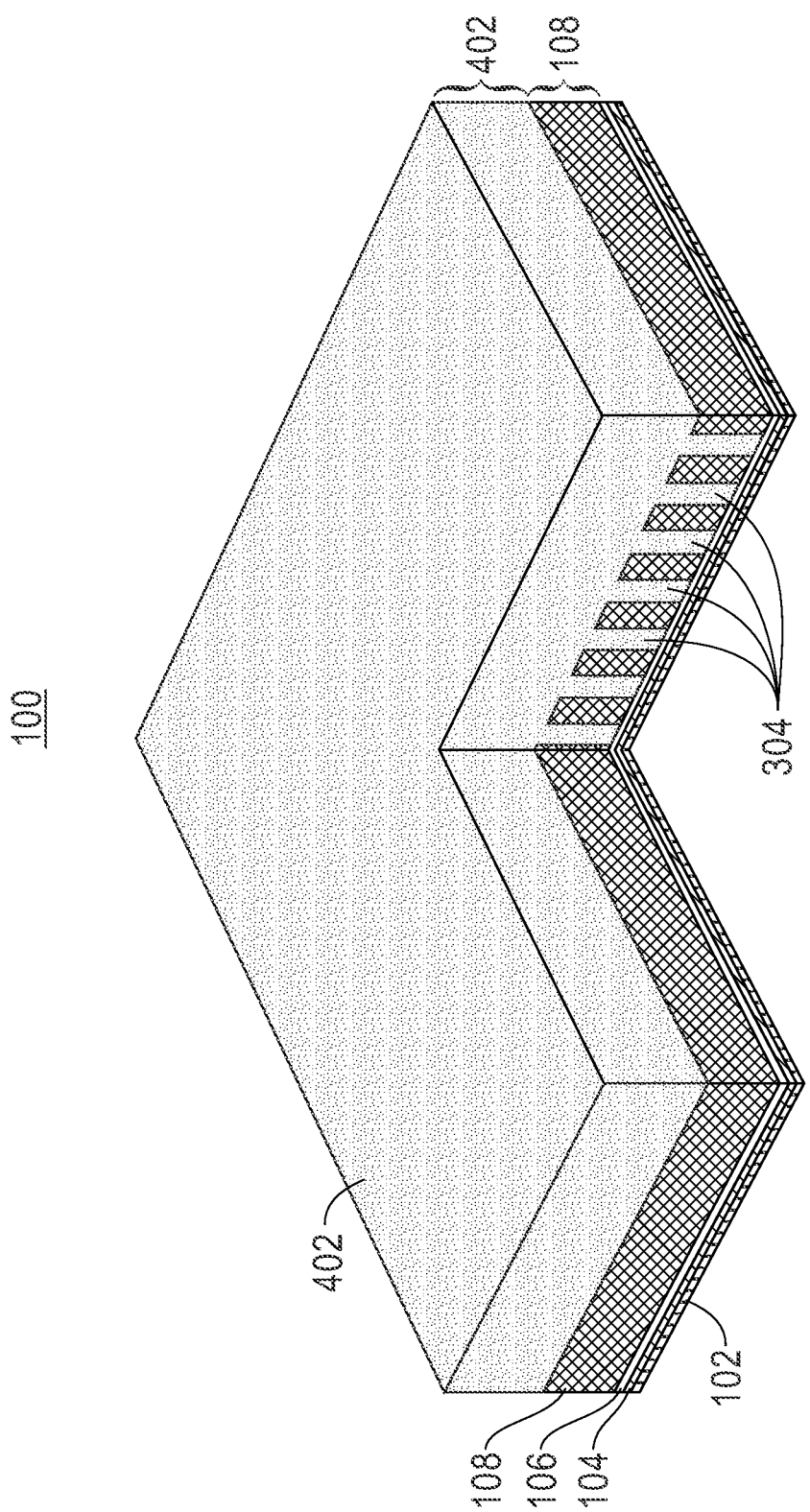
FIG. 4 is a 3D view of the semiconductor structure after depositing a first conductive material, according to an embodiment of the present disclosure.

Referring now to FIG. 4, a 3D view of the semiconductor structure 100 after depositing a first conductive material is shown, according to an embodiment of the present disclosure. In this embodiment, the deposited first conductive material substantially fills the trenches in the bottom connecting vias 304. A top portion of the first conductive material above the bottom connecting vias 304 and the second dielectric layer 108 forms a bottom metal plate 402 (or bottom electrode) of the semiconductor structure 100. According to an embodiment, the bottom connecting vias 304 electrically connects the bottom metal plate 402 to underlying structures.

Example of conductive materials that can be used to form the bottom metal plate 402 and filling the bottom connecting vias 304 include cobalt (Co), ruthenium (Ru), aluminum (Al), titanium (Ti), or tungsten (W), with a metal liner (not shown) including, for example, titanium nitride (TiN). The first conductive material forming the bottom metal plate 402 of the MIMCAP is conformally deposited on the semiconductor structure 100, substantially filling the bottom connecting vias 304, as illustrated in the figure. Methods well-known in the art can be used to deposit the first conductive material forming the bottom metal plate 402 including, for example, atomic layer deposition (ALD), chemical vapor deposition (CVD), or plasma enhanced CVD (PECVD). A (vertical) thickness of the bottom metal plate 402 above the second dielectric layer 108 may vary from approximately 100 nm to approximately 10 μm, and ranges therebetween. The metal liner (not shown) may have a thickness of approximately 3 nm.

Figure 5:
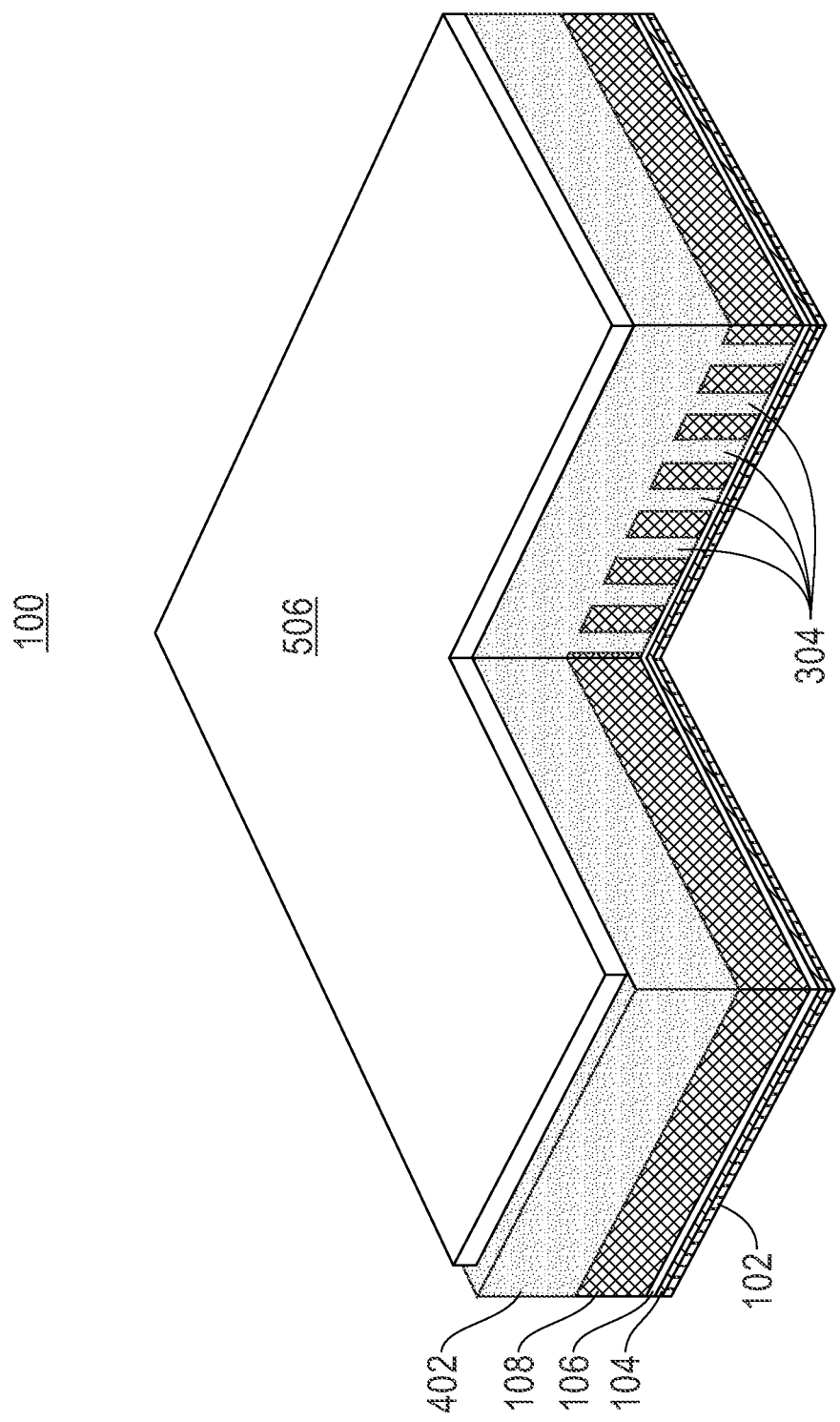
FIG. 5 is a 3D view of the semiconductor structure after depositing a second photoresist layer, according to an embodiment of the present disclosure.
Figure 6:
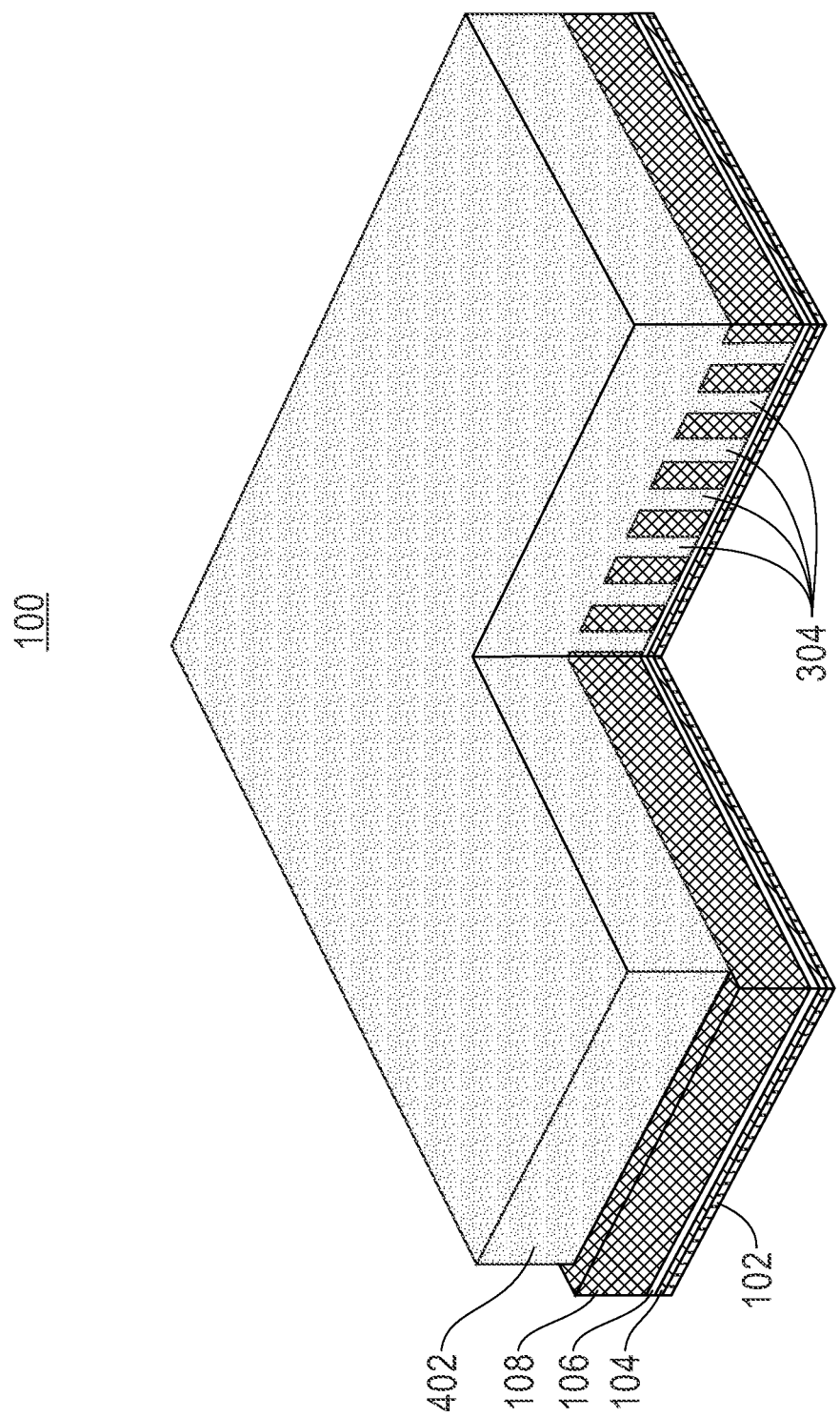
FIG. 6 is a 3D view of the semiconductor structure after patterning of a bottom metal plate, according to an embodiment of the present disclosure.

Referring now to FIG. 5 and FIG. 6 simultaneously, 3D views of the semiconductor structure 100 are shown after depositing a second photoresist layer 506 and patterning of the bottom metal plate 402, according to an embodiment of the present disclosure. Similarly to the process of forming the bottom connecting vias 304 described above, patterning of the bottom metal plate 402 involves exposing a pattern (not shown) on the second photoresist layer 506 and transferring the exposed pattern to the bottom metal plate 402 using known lithography and RIE processing, as depicted in FIG. 6. After transferring the pattern to the bottom metal plate 402, the second photoresist layer 506 can be removed using any photoresist striping method known in the art. This patterning step includes an initial step in the formation of a plurality of interdigitated electrodes or fingers, as will be described in detail below.

Figure 7:
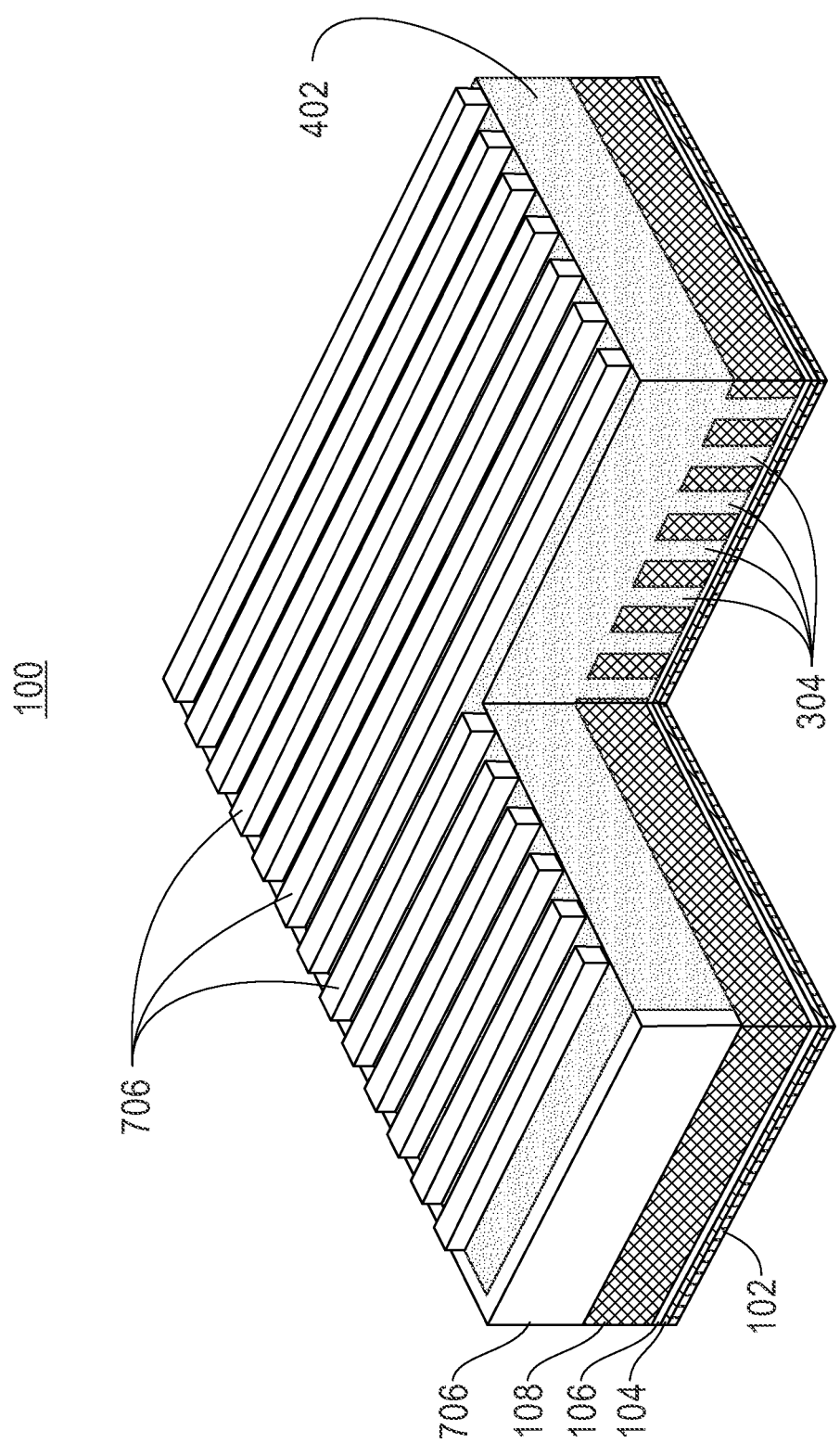
FIG. 7 is a 3D view of the semiconductor structure after depositing a third photoresist layer, according to an embodiment of the present disclosure.
Figure 8:
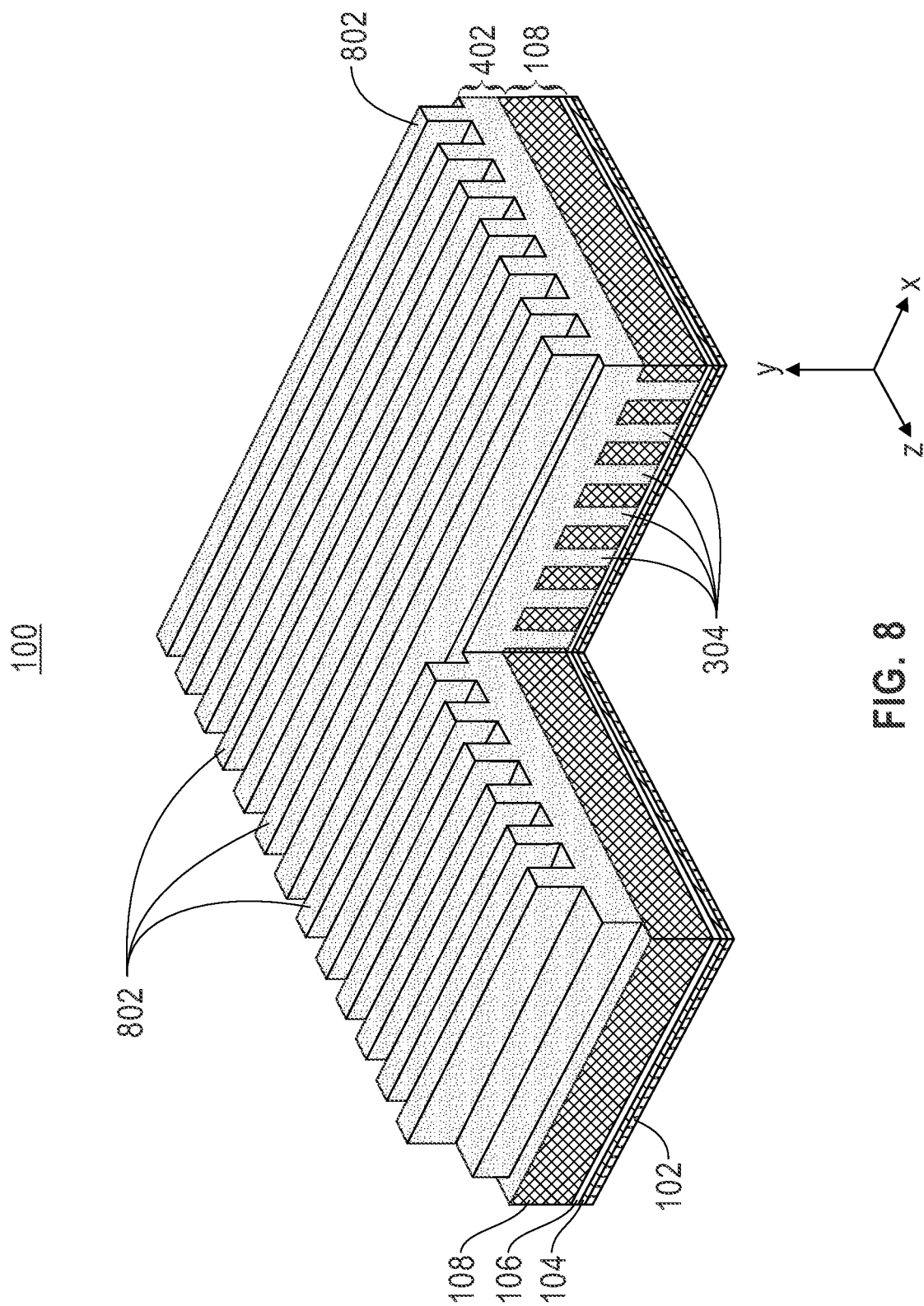
FIG. 8 is a 3D view of the semiconductor structure after patterning the bottom metal plate for forming first interdigitated fingers, according to an embodiment of the present disclosure.

Referring now to FIG. 7 and FIG. 8 simultaneously, 3D views of the semiconductor structure 100 are shown after depositing a third photoresist layer 706 and patterning of the bottom metal plate 402 for forming first interdigitated fingers 802, according to embodiments of the present disclosure. As previously described, patterning of the bottom metal plate 402 involves exposing a pattern on the third photoresist layer 706 and transferring the exposed pattern to the bottom metal plate 402 using known lithography and RIE processing, as shown in FIG. 8. After transferring the pattern to form the first interdigitated fingers 802 of the MIMCAP structure (i.e., the semiconductor structure 100), the third photoresist layer 706 shown in FIG. 7 can be removed using any photoresist striping method known in the art.

The first interdigitated fingers 802 (also referred to as "first vertically interdigitated electrodes") are in electrical communication with the bottom metal plate 402. It should be noted that, the proposed processing sequence allows for the bottom connecting vias 304, the bottom metal plate 402 and the first interdigitated fingers 802 to be formed within the same unitary body. According to embodiments of the present disclosure, this first unitary body including the bottom connecting vias 304, the bottom metal plate 402 and the first interdigitated fingers 802 can be formed using a single deposition process and only three substrative etching steps. This may substantially reduce the number of processing steps and current complexity of MIMCAP's fabrication process.

With continued reference to FIG. 8, each of the first interdigitated fingers 802 may have a height (as measured in the y-direction) varying from approximately 10 nm to approximately 5 μm and ranges therebetween. A width of each of the first interdigitated fingers 802 (as measured in the z-direction) may vary, for example, between approximately 10 nm to approximately 5 μm and ranges therebetween, although a width less than 10 nm and greater than 5 μm may be acceptable.

Figure 9:
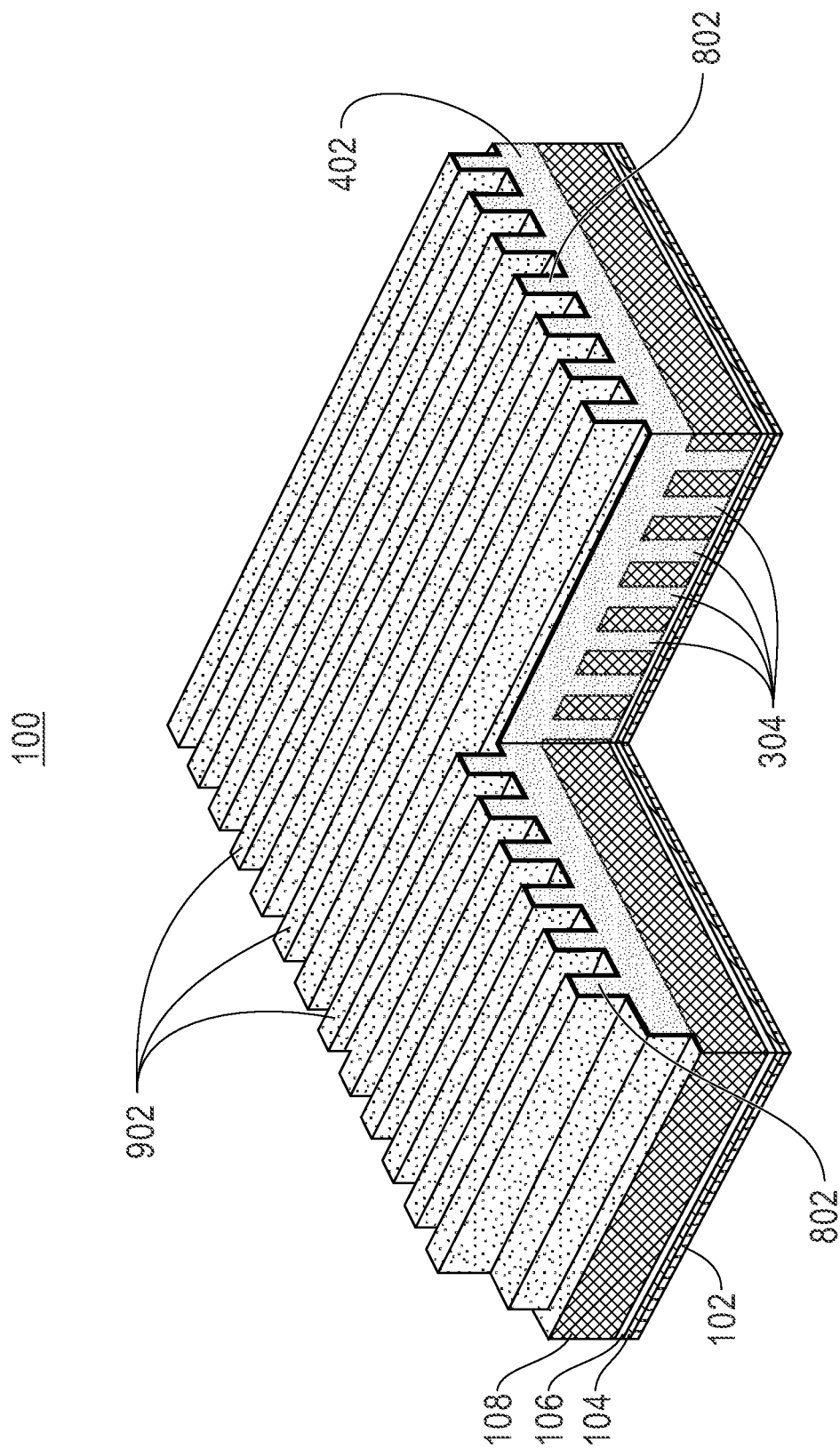
FIG. 9 is a 3D view of the semiconductor structure after forming a second insulation layer, according to an embodiment of the present disclosure.

Referring now to FIG. 9, a 3D view of the semiconductor structure 100 after forming a second insulation layer 902 is shown, according to an embodiment of the present disclosure. The second insulation layer 902 can be conformally deposited on the semiconductor structure 100 directly above the first interdigitated fingers 802 and remaining portions of the bottom metal plate 402, as shown in the figure.

Figure 10:
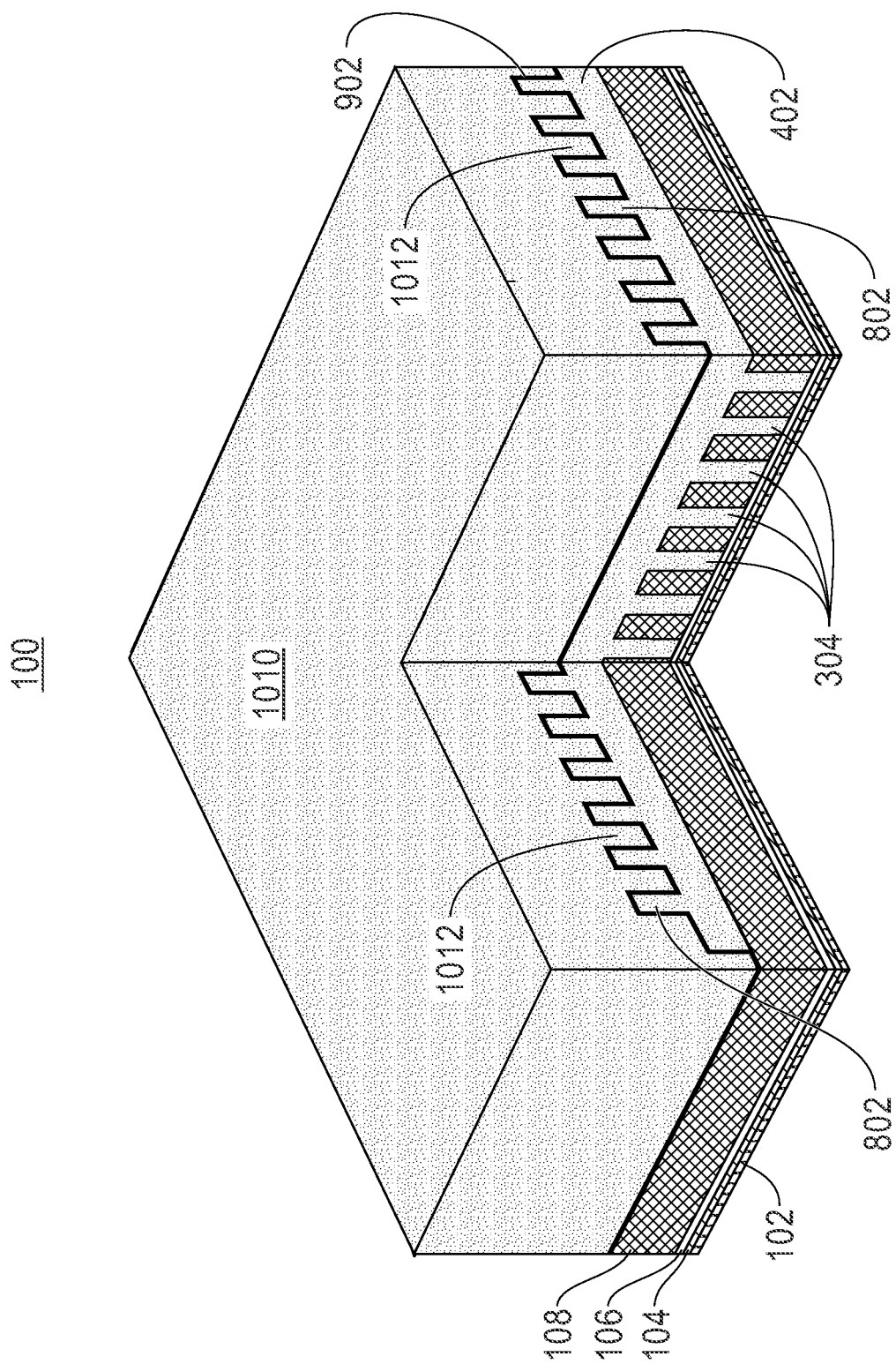
FIG. 10 is a 3D view of the semiconductor structure after depositing a second conductive material, according to an embodiment of the present disclosure.

The second insulation layer 902 may (electrically) separate the bottom metal plate 402 from a subsequently formed top metal plate (FIG. 10). In an embodiment, the second insulation layer 902 includes a high dielectric constant (i.e., high-k dielectric) material including, for example, aluminum oxide ($Al_2O_3$), hafnium oxide ($HfO_2$), tantalum oxide ($Ta_2O_5$), and laminate stacks thereof. As known by those skilled in the art, such high-k dielectric materials may allow for high capacitance values for a given insulator film thickness. Known deposition techniques can be implemented to form the second insulation layer 902 including, for example, atomic layer deposition (ALD). The second insulation layer 902 may have a thickness varying from approximately 0.1 nm to approximately 1000 nm, and ranges therebetween.

Referring now to FIG. 10, a 3D view of the semiconductor structure 100 after depositing a second conductive material is shown, according to an embodiment of the present disclosure. In this embodiment, the deposited second conductive material forms a top metal plate 1010 (or top electrode) of the semiconductor structure 100. The second conductive material may include similar or different materials as the first conductive material forming the bottom metal plate 402.

Example of conductive materials that can be used to form the top metal plate 1010 include cobalt (Co), ruthenium (Ru), aluminum (Al), titanium (Ti), or tungsten (W), with a metal liner (not shown) including, for example, titanium nitride (TiN. The second conductive material forming the top metal plate 1010 of the MIMCAP structure (i.e., the semiconductor structure 100) is deposited directly above the second insulation layer 902. Methods well-known in the art can be used to deposit the second conductive material forming the top metal plate 1010 including, for example, ALD, CVD, or PECVD. A thickness of the top metal plate 1010 may vary from approximately 10 nm to approximately 5 μm nm, and ranges therebetween.

It should be noted that deposition of the top metal plate 1010 simultaneously forms second interdigitated fingers 1012 (also referred to as "second vertically interdigitated electrodes") of the interdigitated MIMCAP structure. The second interdigitated fingers 1012 are in electrical communication with the top metal plate 1010. As depicted in the figure, the second interdigitated fingers 1012 are formed below the top metal plate 1010, and interleaved or interdigitated with the first interdigitated fingers 802. Thus, the first interdigitated fingers 802 and the second interdigitated fingers 1012 are interleaved or interdigitated with one another with the insulating layer 902 disposed between them. Additionally, because the vertically interdigitated electrodes are interleaved using conformal deposition methods, there is little chance of misalignment between the first and second interdigitated fingers 802, 1012. This step defines the first and second interdigitated fingers 802, 1012 (i.e., the vertically interdigitated electrodes) which serve to increase the charge collecting surface area of the MIMCAP structure.

Figure 11:
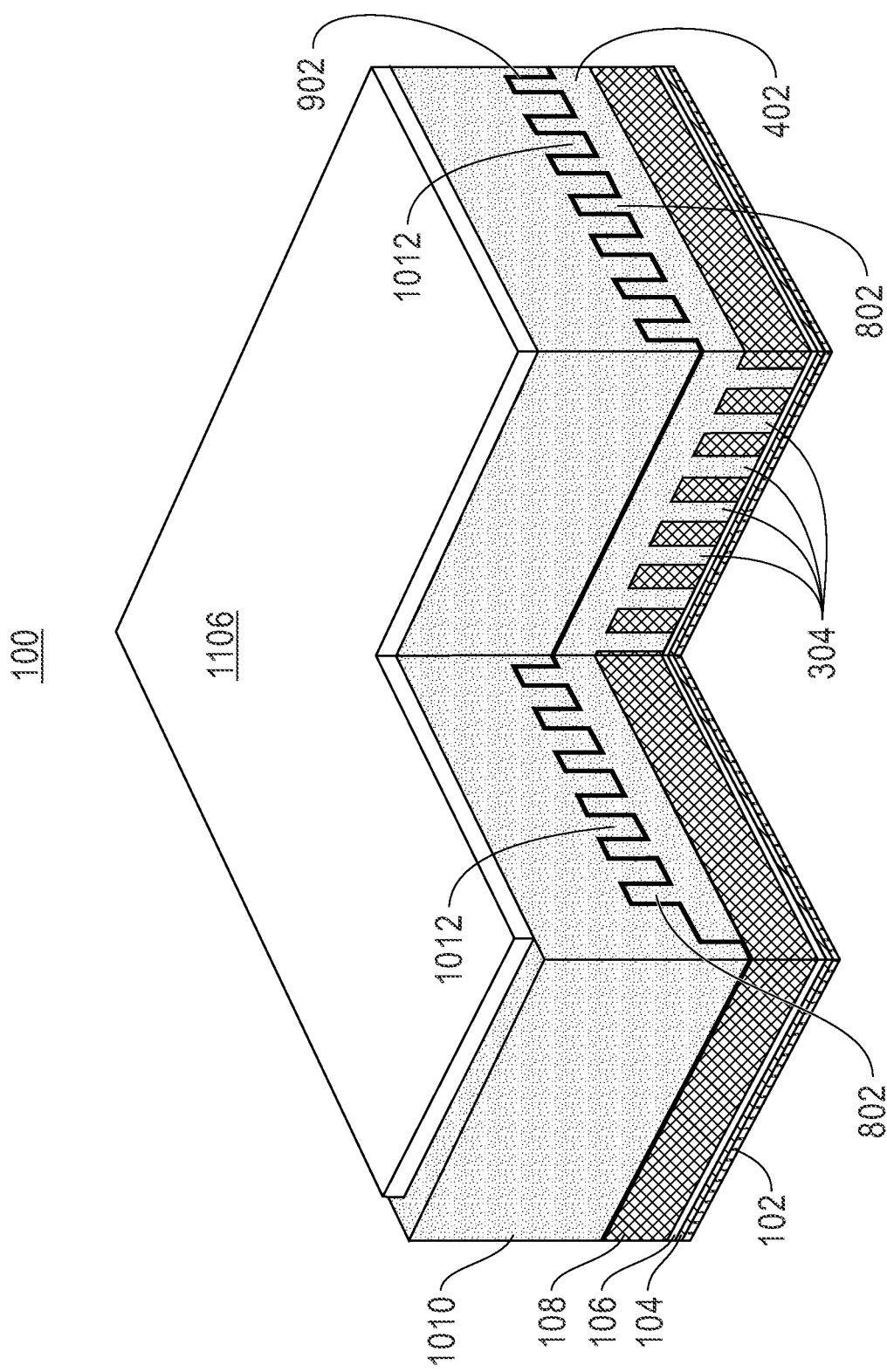
FIG. 11 is a 3D view of the semiconductor structure after depositing a fourth photoresist layer, according to an embodiment of the present disclosure.
Figure 12:
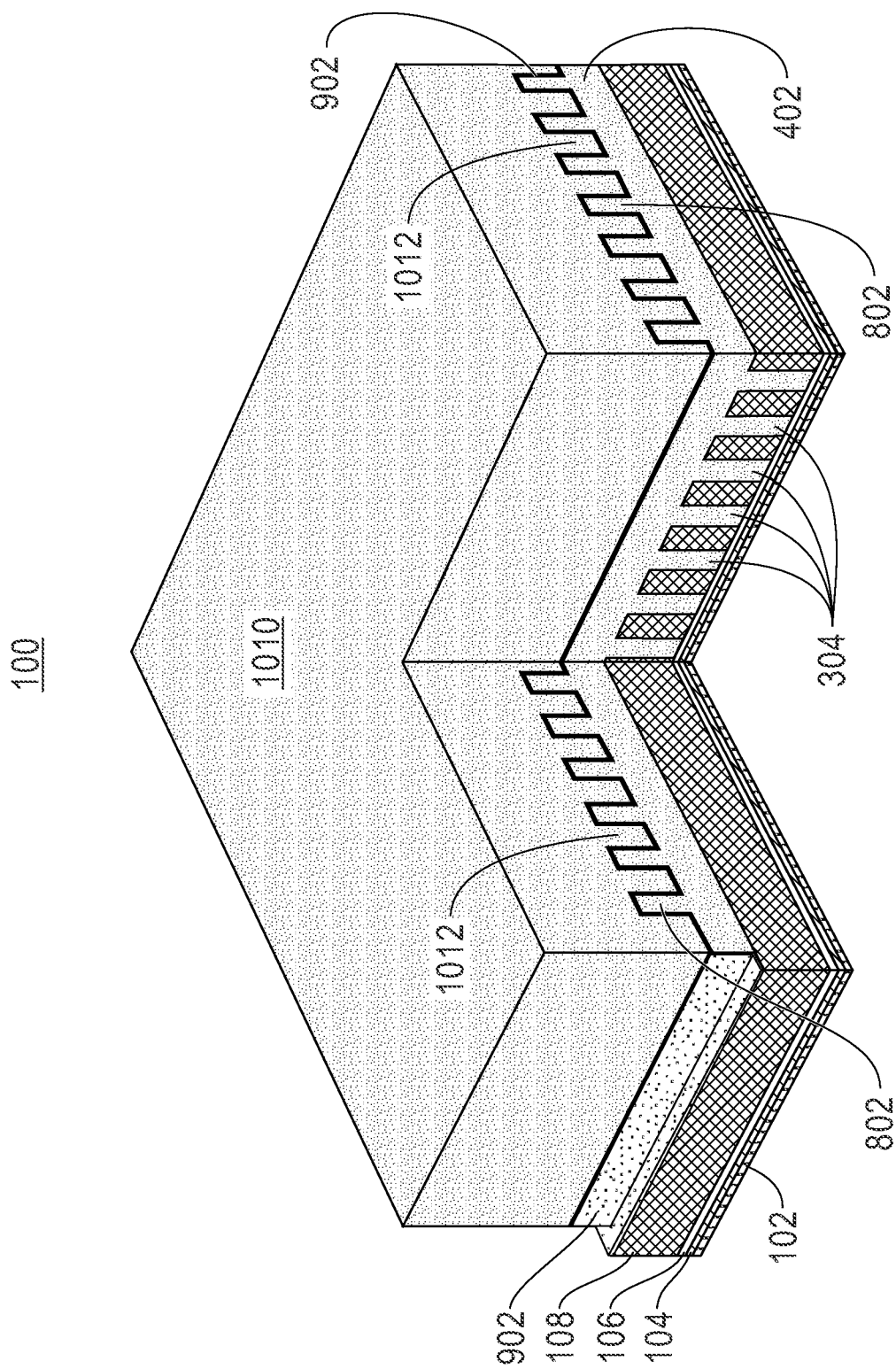
FIG. 12 is a 3D view of the semiconductor structure after patterning a top metal plate, according to an embodiment of the present disclosure.

Referring now to FIG. 11 and FIG. 12 simultaneously, 3D views of the semiconductor structure 100 after top metal plate lithography are shown, according to an embodiment of the present disclosure. In this embodiment, a fourth photoresist layer 1106 (FIG. 11) is deposited on the semiconductor structure 1000, directly above the top metal plate 1010 for subsequent lithography and RIE processing. Similar to lithography steps previously described, patterning of the top metal plate 1010 involves exposing a pattern on the fourth photoresist layer 1106 and transferring the exposed pattern to the top metal plate 1010 using known lithography and RIE processing, as shown in FIG. 12. After transferring the pattern, the fourth photoresist layer 1106 (FIG. 11) can be removed using any photoresist striping method known in the art. It should be noted that after patterning the top metal plate 1010, a portion of the second insulation layer 902 is exposed, as can be observed in FIG. 12. It should be noted that this patterning step helps defining a shape of the second interdigitated fingers 1012.

Figure 13:
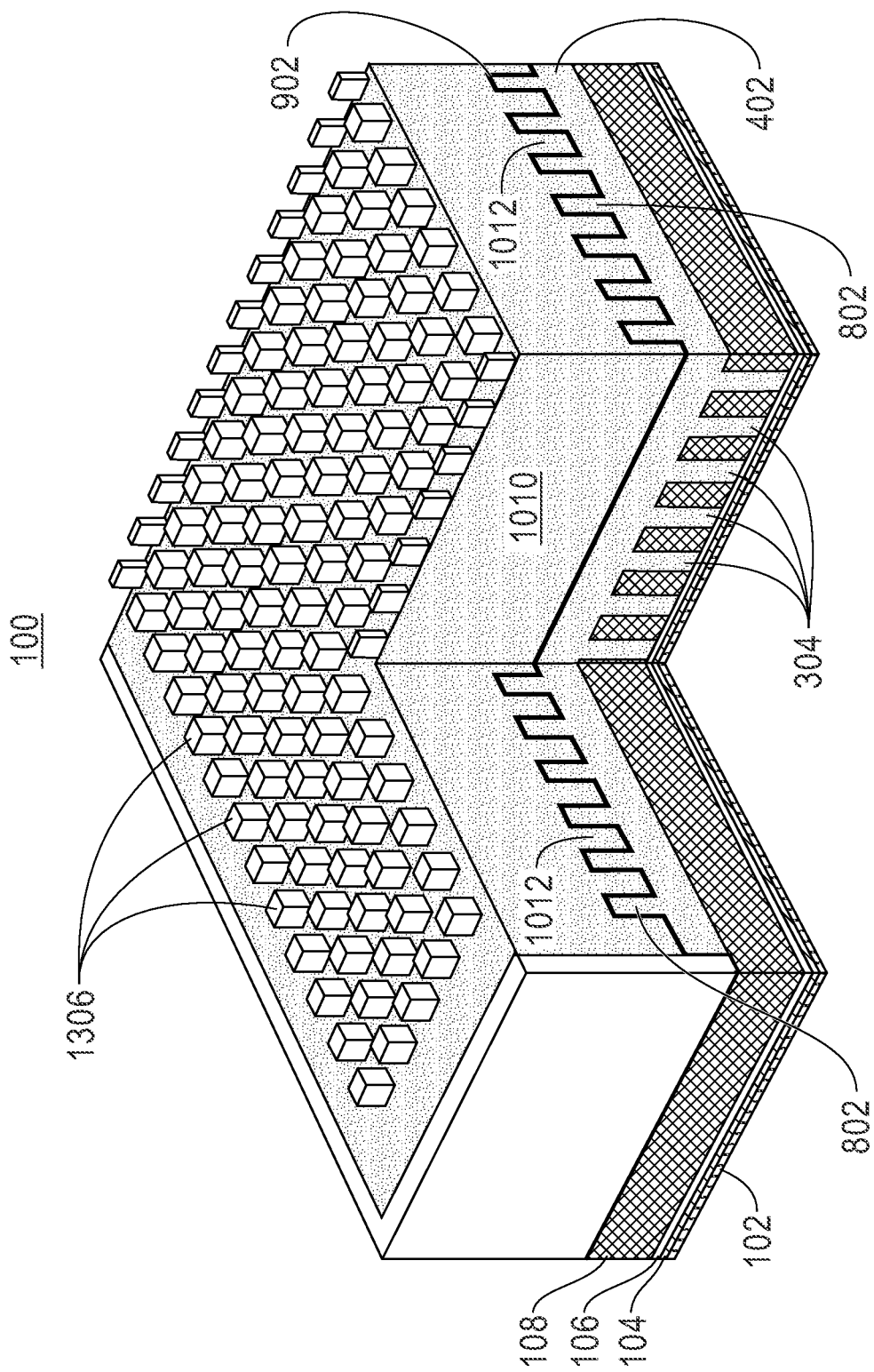
FIG. 13 is a 3D view of the semiconductor structure after depositing a fifth photoresist layer, according to an embodiment of the present disclosure.
Figure 14:
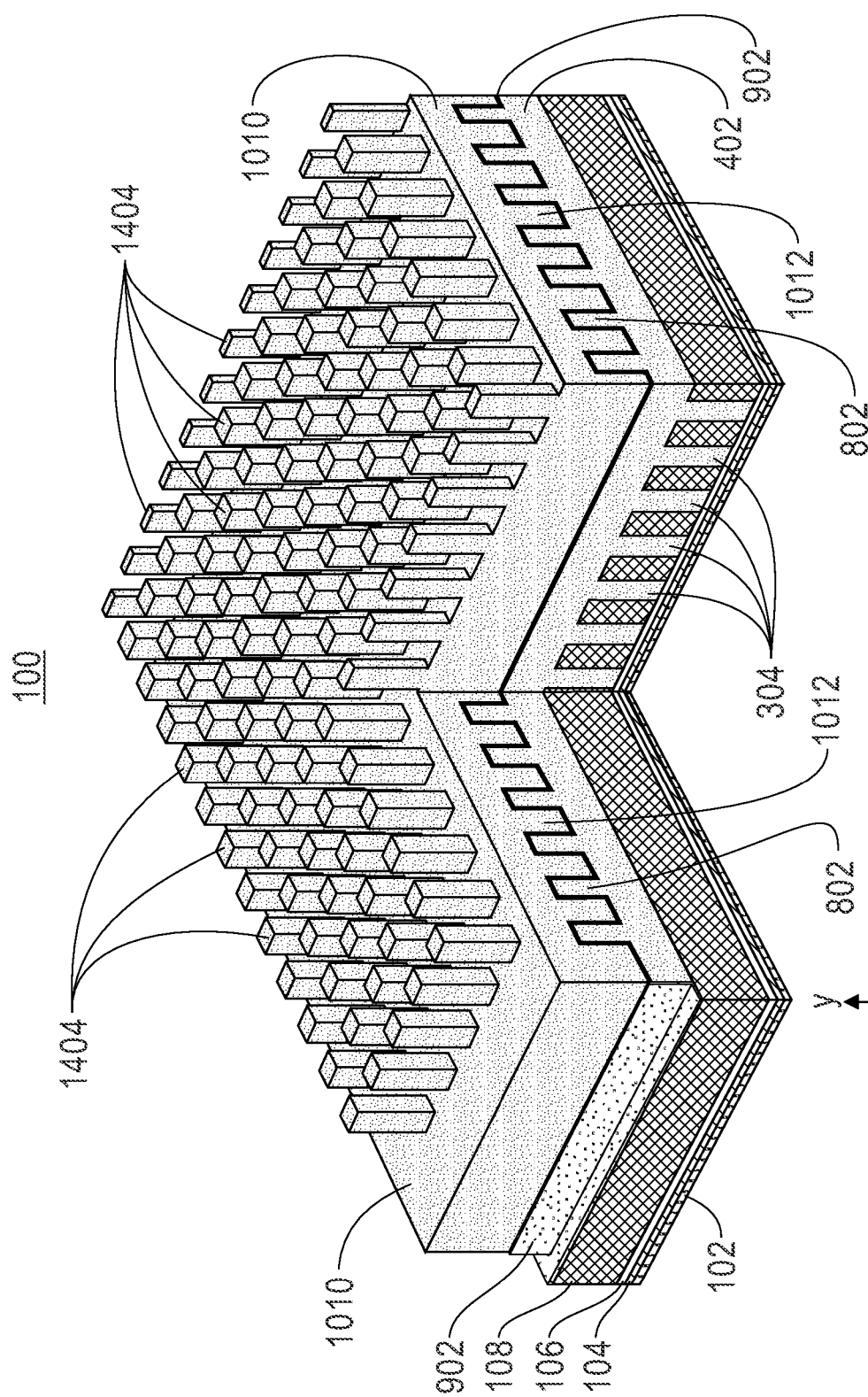
FIG. 14 is a 3D view of the semiconductor structure after forming top connecting vias, according to an embodiment of the present disclosure.

Referring now to FIG. 13 and FIG. 14 simultaneously, 3D views of the semiconductor structure 100 after depositing a fifth photoresist layer 1306 and forming top connecting vias 1404 are shown, according to an embodiment of the present disclosure. The fifth photoresist layer 1306 is deposited above the patterned top metal plate 1010 for forming the top connecting vias 1404 (FIG. 14) using known lithography and RIE processing.

Similar to previous lithography steps, patterning of the top metal plate 1010 to form the top connecting vias 1404 involves exposing a pattern on the fifth photoresist layer 1306 and transferring the exposed pattern to the top metal plate 1010, as shown in FIG. 14. After transferring the pattern and forming the top connecting vias 1404, the fifth photoresist layer 1306 can be removed using any photoresist striping method known in the art including, for example, plasma ashing.

With continued reference to FIG. 14, according to an embodiment, the top connecting vias 1404 extend vertically from the top metal plate 1010. The top connecting vias 1404 may electrically connect the top metal plate 1010 with subsequently formed structures. A width of each of the top connecting vias 1404 (as measured in the x-direction) may vary, for example, between approximately 10 nm and approximately 1 μm and ranges therebetween, although a width less than 10 nm and greater than 1 μm may be acceptable. A height of each of top connecting vias 1404 (as measured in the y-direction) may be approximately 100 nm.

It should be noted that, the proposed processing sequence allows for the top connecting vias 1404, the top metal plate 1010 and the second interdigitated fingers 1012 to be formed within the same unitary body. According to embodiments of the present disclosure, this second unitary body including the top connecting vias 1404, the top metal plate 1010 and the second interdigitated fingers 1012 can be formed using a single deposition process and two substrative etching steps. As mentioned above, the proposed embodiments may substantially reduce the number of processing steps and the complexity of MIMCAP's fabrication.

Figure 15:
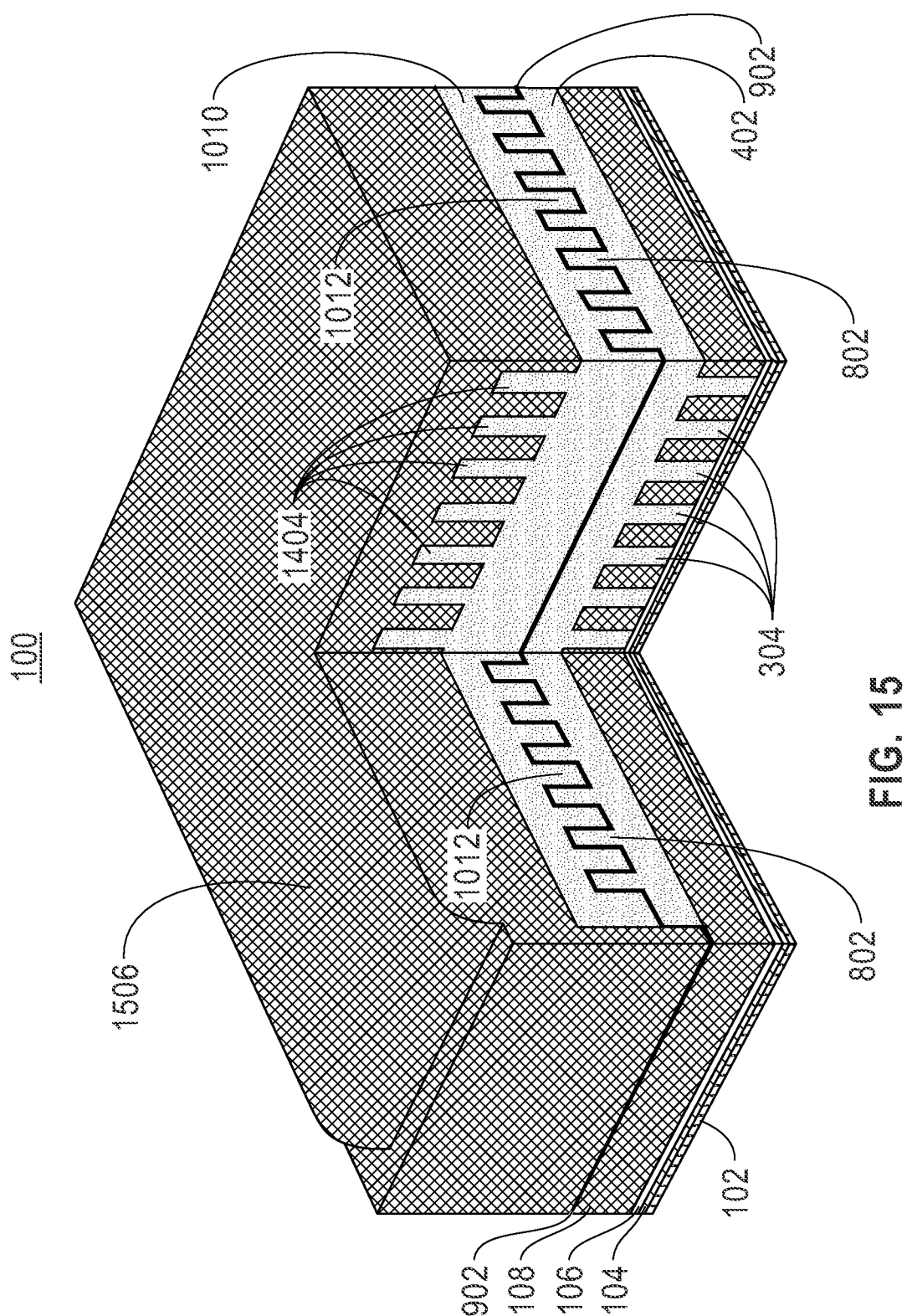
FIG. 15 is a 3D view of the semiconductor structure after depositing a dielectric layer, according to an embodiment of the present disclosure.
Figure 16:
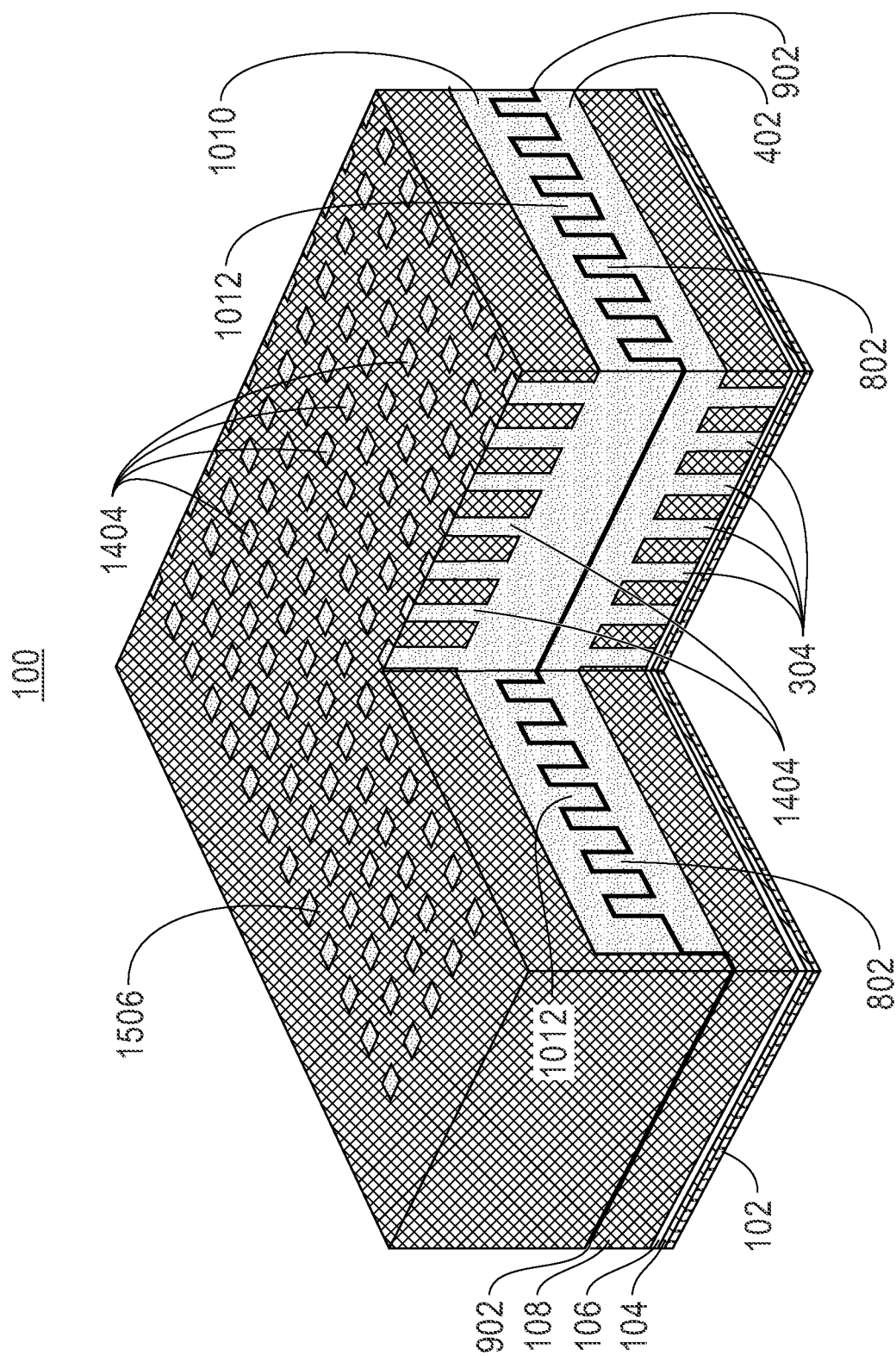
FIG. 16 is a 3D view of the semiconductor structure after planarizing the dielectric layer, according to an embodiment of the present disclosure.

Referring now to FIG. 15 and FIG. 16 simultaneously, 3D views of the semiconductor structure 100 after depositing and planarizing a third dielectric layer 1506 are shown, according to embodiments of the present disclosure. The third dielectric layer 1506 can be formed by, for example, chemical vapor deposition (CVD) of a dielectric material. Non-limiting examples of dielectric materials to form the third dielectric layer 1506 may include silicon oxide, silicon nitride, hydrogenated silicon carbon oxide, silicon based low-k dielectrics, flowable oxides, porous dielectrics, or organic dielectrics including porous organic dielectrics.

After depositing the third dielectric layer 1506, a chemical mechanical polishing (CMP) process is conducted on the semiconductor structure 100 to remove excess materials and create a smooth planar surface, as depicted in FIG. 16.

Therefore, embodiments of the present disclosure provide an interdigitated metal-insulator-metal capacitor in which top and bottom interconnect structures (interdigitated electrodes, connecting vias, and electrode plates) are formed within respective single unitary bodies separated by a high-k insulating layer using a reduced number of processing steps (i.e., five lithography steps and five etching steps). The proposed embodiments allow utilizing vertically interdigitated electrodes to increase the capacitor area surface while maintaining a minimal horizontal foot print. Specifically, a height of the interdigitated fingers or vertically interdigitated electrodes can be increased to increase MIMCAPs total capacitance. In some embodiments, the total capacitance may be three times higher with a 2:1 aspect ratio (AR). Specifically, since the width of the interdigitated fingers is fixed, the aspect ratio can be controlled by a height of the interdigitated fingers (i.e., can be controlled by the etch depth of the interdigitated fingers).

Additionally, the proposed embodiments facilitate vertically stacking MIMCAP structures in a multilevel fashion to further increase total capacitance.

According to an embodiment, the proposed interdigitated metal-insulator-metal capacitor structure is made of a first unitary body of a first conductive material including a first metal plate, a first set of interdigitated electrodes protruding upwards from a top surface of the first metal plate, and a first set of connecting vias protruding downwards from a bottom surface of the first metal plate, a second unitary body of a second conductive material disposed above the first unitary body, the second unitary body comprising a second metal plate, a second set of interdigitated electrodes protruding downwards from a bottom surface of the second metal plate, and a second set of connecting vias protruding upwards from a top surface of the second metal plate, the first set of interdigitated electrodes being interleaved with the second set of interdigitated electrodes, and an insulating layer disposed between the first unitary body and the second unitary body for electrically separating the first set of interdigitated electrodes from the second set of interdigitated electrodes.

In this embodiment, the first conductive material and the second conductive material includes at least one of cobalt, ruthenium, aluminum, titanium, and tungsten with a thin liner made of, for example, titanium nitride. The insulating layer includes a high-k dielectric material such as aluminum oxide, hafnium oxide, or tantalum oxide. The first set of interdigitated electrodes and the second set of interdigitated electrodes have an aspect ratio of at least 1:1 for increasing a total capacitance of the metal-insulator-metal capacitor structure.

The interdigitated metal-insulator-metal capacitor structure further includes a second insulating layer disposed above a semiconductor substrate and below the first set of connecting vias. The second insulating layer comprises nitrogen-doped silicon carbide.

According to another embodiment, a method of forming the interdigitated metal-insulator-metal capacitor includes the steps of forming a first set of connecting vias within a first dielectric layer disposed above a semiconductor substrate, depositing a first conductive material above the first dielectric layer, the first conductive material filling the first set of connecting vias, patterning a top portion of the first conductive material to form a first set of interdigitated electrodes, a remaining portion of the first conductive material below the first set of interdigitated electrodes including a first metal plate, and conformally depositing an insulating layer above the first conductive material for electrically separating the first set of interdigitated electrodes and the first metal plate.

The proposed method further includes depositing a second conductive material above the insulating layer. Depositing the second conductive material forms a second set of interdigitated electrodes interleaved with the first set of interdigitated electrodes. The method further includes patterning a top portion of the second conductive material to form a second set of connecting vias, a remaining portion of the second conductive material below the second set of connecting vias forms a second metal plate.

In this embodiment, the first set of connecting vias electrically connects the first metal plate to underlying structures disposed in the semiconductor substrate, and the first set of interdigitated electrodes are in electrical communication with the first metal plate for increasing a charge collecting surface area of the interdigitated metal-insulator-metal capacitor.

In this embodiment, the second set of interdigitated electrodes are in electrical communication with the second metal plate for further increasing the charge collecting surface area of the interdigitated metal-insulator-metal capacitor, and the second set of connecting vias electrically connects the second metal plate to subsequently formed structures. Further, the first set of interdigitated electrodes and the second set of interdigitated electrodes have an aspect ratio of at least 1:1 for increasing a total capacitance of the metal-insulator-metal capacitor structure.

The method further includes forming a second insulating layer above the semiconductor substrate and below the first set of connecting vias, the second insulating layer comprises nitrogen-doped silicon carbide.

Although the invention has been shown and described with respect to a certain embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the described structure which performs the function in the herein illustrated exemplary embodiments of the invention. In addition, while a particular feature of the invention may have been described with respect to only one of several embodiments, such feature may be combined with one or more features of the other embodiments as may be desired and advantageous for any given or particular application.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An interdigitated metal-insulator-metal capacitor structure, comprising:
   a first unitary body of a first conductive material comprising a first metal plate, a first set of interdigitated electrodes protruding upwards from a top surface of the first metal plate, and a first set of connecting vias protruding downwards from a bottom surface of the first metal plate;
   a second unitary body of a second conductive material disposed above the first unitary body, the second unitary body comprising a second metal plate, a second set of interdigitated electrodes protruding downwards from a bottom surface of the second metal plate, and a second set of connecting vias protruding upwards from a top surface of the second metal plate, the first set of interdigitated electrodes being interleaved with the second set of interdigitated electrodes, each of the first set of interdigitated electrodes and the second set of interdigitated electrodes having an aspect ratio of at least 1:1; and
   an insulating layer disposed between the first unitary body and the second unitary body for electrically separating the first set of interdigitated electrodes from the second set of interdigitated electrodes to form the interdigitated metal-insulator-metal capacitor.

2. The interdigitated metal-insulator-metal capacitor structure of claim 1, wherein the first conductive material comprises at least one of cobalt, ruthenium, aluminum, titanium, and tungsten.

3. The interdigitated metal-insulator-metal capacitor structure of claim 1, wherein the second conductive material comprises at least one of cobalt and ruthenium, aluminum, titanium, and tungsten.

4. The interdigitated metal-insulator-metal capacitor structure of claim 1, wherein the insulating layer comprises a high-k dielectric material.

5. The interdigitated metal-insulator-metal capacitor structure of claim 4, wherein the high-k dielectric material comprises at least one of aluminum oxide, hafnium oxide, and tantalum oxide.

6. The interdigitated metal-insulator-metal capacitor structure of claim 1, wherein the first set of interdigitated electrodes and the second set of interdigitated electrodes having the aspect ratio of at least 1:1 increases a total capacitance of the metal-insulator-metal capacitor structure.

7. The interdigitated metal-insulator-metal capacitor structure of claim 1, further comprising:
   a second insulating layer disposed above a semiconductor substrate and below the first set of connecting vias.

8. The interdigitated metal-insulator-metal capacitor structure of claim 7, wherein the second insulating layer comprises nitrogen-doped silicon carbide.

* * * * *